United States Patent
Subramanian et al.

(10) Patent No.: US 6,455,416 B1
(45) Date of Patent: Sep. 24, 2002

(54) DEVELOPER SOLUBLE DYED BARC FOR DUAL DAMASCENE PROCESS

(75) Inventors: Ramkumar Subramanian, San Jose, CA (US); Bhanwar Singh, Morgan Hill, CA (US); Bharath Rangarajan, Santa Clara, CA (US); Michael K. Templeton, Atherton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/706,967

(22) Filed: Nov. 6, 2000

Related U.S. Application Data (60) Provisional application No. 60/242,878, filed on Oct. 24, 2000.

(51) Int. Cl.$^7$ .......................................... H01L 21/4763
(52) U.S. Cl. ..................... 438/636; 438/618; 438/622; 438/623; 438/624; 438/637; 438/638
(58) Field of Search .................... 438/618, 620, 438/622, 623, 624, 629, 636, 637, 638, 652, 672, 700

(56) References Cited

U.S. PATENT DOCUMENTS

| | | | |
|---|---|---|---|
| 4,587,138 A | * 5/1986 | Yau et al. | 438/660 |
| 4,822,718 A | * 4/1989 | Latham et al. | 430/271.1 |
| 4,910,122 A | 3/1990 | Arnold et al. | 430/313 |
| 5,554,485 A | 9/1996 | Dichiara et al. | 430/271.1 |
| 5,858,621 A | 1/1999 | Yu et al. | 430/313 |
| 5,882,996 A | 3/1999 | Dai | 438/597 |
| 5,919,599 A | * 7/1999 | Meador et al. | 430/271.1 |
| 5,920,796 A | 7/1999 | Wang et al. | 438/700 |
| 5,963,841 A | 10/1999 | Karlsson et al. | 438/952 |
| 6,025,259 A | * 2/2000 | Yu et al. | 438/618 |
| 6,057,239 A | * 5/2000 | Wang et al. | 438/689 |
| 6,103,456 A | * 8/2000 | Tobben et al. | 430/317 |
| 6,329,118 B1 | * 12/2001 | Hussein et al. | 430/270.1 |

* cited by examiner

*Primary Examiner*—Carl Whitehead, Jr.
*Assistant Examiner*—Maria Guerrero
(74) *Attorney, Agent, or Firm*—Amin & Turocy, LLP (57) ABSTRACT

One aspect of the present invention relates to a method of processing a semiconductor structure, involving the steps of providing a substrate having an insulation layer thereover; forming a first antireflection coating over the insulation layer; patterning a first resist over the antireflection coating; forming a plurality of vias in the insulation layer and the first antireflection coating, the vias having a first width; filling the via with a second antireflection coating, the second antireflection coating comprising a dye and a film forming material; patterning a second resist over the structure and removing the second antireflection coating from the via; forming a trench over the plurality of vias in the insulation layer, the trench having a width that is larger than the average width of the vias; and filling the trench and vias with a conductive material. The present invention provides improved dual damascene methods for substrates by using a developer soluble ARC containing a dye to facilitate the formation of trenches directly over the previously formed vias.

20 Claims, 4 Drawing Sheets

DEVELOPER SOLUBLE DYED BARC FOR DUAL DAMASCENE PROCESS

RELATED APPLICATIONS

This application claims domestic priority to provisional application Ser. No. 60/242,878 filed Oct. 24, 2000.

TECHNICAL FIELD

The present invention generally relates to processing a semiconductor substrate. In particular, the present invention relates to employing a developer soluble dyed film to improve the formation of trenches.

BACKGROUND ART

Conventional semiconductor devices typically comprise a semiconductor substrate, normally made of monocrystalline silicon, and a plurality of dielectric and conductive layers formed thereon. An integrated circuit is formed containing a plurality of conductive patterns comprising conductive lines separated by interwiring spacings, and a plurality of interconnect lines, such as bus lines, bit lines, word lines and logic interconnect lines. Such interconnection lines, made of metal interconnect materials, generally constitute a limiting factor in terms of size (width) and various functional characteristics of the integrated circuit. As such, there exists a need to provide a reliable interconnection structure having a small size yet capable of achieving higher operating speeds, improved signal-to-noise ratio and improved reliability.

Using a dual damascene process, semiconductor devices are patterned with several thousand openings for conductive lines and vias which are filled with a conductive metal, and serve to interconnect the active and/or passive elements of the integrated circuit. The dual damascene process also is used for forming the multilevel signal lines of conductive metal in the insulating layers of multilayer substrate on which semiconductor devices are mounted.

Damascene (single damascene) is an interconnection fabrication process in which grooves are formed in an insulating layer and filled with metal to form the conductive lines. Dual damascene is a multi-level interconnection process in which, in addition to forming the grooves of single damascene, the conductive via openings also are formed. In the standard dual damascene process, the insulating layer is coated with a resist material which is exposed to a first mask with the image pattern of the via openings and the pattern is anisotropically etched in the upper half of the insulating layer. This is the via mask step. After removal of the patterned resist material, the insulating layer is coated with a resist material which is exposed to a second mask with the image pattern of the conductive lines in alignment with the via openings. In anisotropically etching the openings for the conductive lines in the upper half of the insulating material, the via openings already present in the upper half are simultaneously etched in the lower half of the insulating material. This is the trench mask step. After the etching is complete, both the vias and grooves are filled metal.

Dual damascene is an improvement over single damascene because it permits the filling of both the conductive grooves and vias with metal at the same time, thereby eliminating process steps. Although standard dual damascene offers advantages over other processes for forming interconnections, it has a number of disadvantages and problems. For example, after the trench mask (second mask) is patterned, resist debris undesirably collect in the recently formed vias. The existence of resist debris in the bottom of the vias leads to poor electrical connections, and possible device failure once the integrated circuit is completed.

Another problem associated with formation of the trench/via openings is reflectivity. Reflectivity causes linewidth variations and degrades lithography processing. Especially in processes where transparent layers are employed, and especially in instances where transparent layers are employed over reflective layers, it is difficult to accurately pattern (for example, due to reflectivity concerns) the masks (resist for forming the vias/trenches). As a result of these concerns, antireflection coatings (ARC) or layers may be employed in an attempt to minimize reflectivity.

Figure 1:
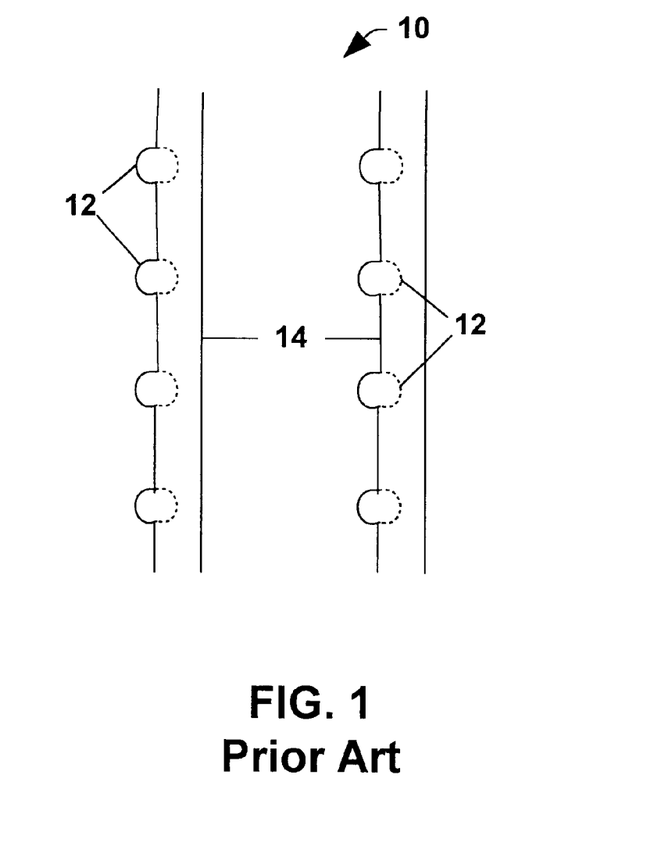
FIG. 1 is a top down illustration of a trench/via pattern in a substrate made using a prior art dual damascene process.
Figure 2:
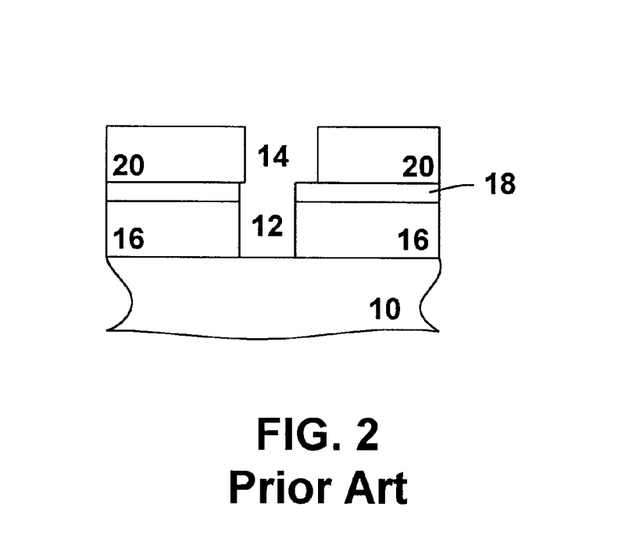
FIG. 2 is cross-sectional illustration of a substrate during a prior art dual damascene process.

Yet another problem associated with formation of the trench/via openings is illustrated in FIGS. 1 and 2. FIGS. 1 and 2 demonstrate that even when an ARC is employed over reflective layers, it is difficult to accurately pattern the second mask (resist for forming the trenches). Referring to FIG. 1, the results of inaccurately patterning the second mask are shown. In particular, on substrate 10, a plurality of vias 12 and trenches 14 are shown from top-down perspective. The trenches 14 are not centered directly over vias 12; instead, the trenches 14 are positioned undesirably to the right of and over vias 12. The misalignment of trenches 14 relative to vias 12 is caused by reflectivity differences between the ARC, insulator, and/or underlying substrate when exposing the trench mask (resist) to actinic radiation.

Referring to FIG. 2, another view of the results of inaccurately patterning the second mask are shown. Over substrate 10 is patterned insulation layer 16 (patterned to contain via 12) and ARC 18 (also patterned to contain via 12). However, due to reflectivity differences between ARC 18 and substrate 10, patterned photoresist 20 (patterned to mask for a trench 14) is not aligned directly over via 12. The subsequently formed trench 14 will be positioned undesirably to the right of and over via 12. Accordingly, even if ARCs are employed in a dual damascene process, the via etch removes a portion of the ARC positioned above the insulation layer, thus leading to potential problems.

Generally speaking, the reflectivity concerns lead to malformed and/or misaligned trenches with relation to the vias. This consequently degrades the electrical properties of the resultant electronic devices. It is therefore desirable to improve the dual damascene process by minimizing poor critical dimension control and/or reflectivity concerns.

SUMMARY OF THE INVENTION

The present invention provides improved dual damascene methods for substrates by using a developer soluble ARC containing a dye to facilitate the formation of trenches directly over (accurately aligned) the previously formed vias. Moreover, by providing an ARC containing a dye in the manner dictated by the present invention, the accumulation of resist contaminants in vias upon developing the trench mask is minimized and/or eliminated.

One aspect of the present invention relates to a method of processing a semiconductor structure, involving the steps of providing a substrate having an insulation layer thereover; forming a first antireflection coating over the insulation layer; patterning a first resist over the antireflection coating; forming a plurality of vias in the insulation layer and the first antireflection coating, the vias having a first width; filling the via with a second antireflection coating, the second antireflection coating comprising a dye and a film forming material; patterning a second resist over the structure and removing the second antireflection coating from the via; forming a trench over the plurality of vias in the insulation layer, the trench having a second width that is larger than the first width; and filling the trench and vias with a conductive material.

Another aspect of the present invention relates to a dual damascene process, involving the steps of depositing a silicon oxynitride layer over a substrate comprising an interlayer dielectric; patterning a first resist over the silicon oxynitride layer; forming a via within the interlayer dielectric and the silicon oxynitride layer; depositing an organic antireflection coating into the via, the organic antireflection coating comprising a dye and a film forming material; depositing a second resist layer over the substrate; developing the second resist layer and simultaneously removing the organic antireflection coating from the via; forming a trench within the interlayer dielectric and the silicon oxynitride layer and directly above the via; depositing a conductive metal into the trench and the via.

Yet another aspect of the present invention relates to a method of forming a trench mask in a dual damascene process, involving the steps of providing a substrate comprising an insulation layer thereon having an inorganic antireflection coating thereover, the insulation layer and the inorganic antireflection coating comprising a via therein; depositing an organic antireflection coating comprising a dye and a film forming material over the inorganic antireflection coating and into the via; depositing a photoresist over the organic antireflection coating; irradiating the photoresist with light having a wavelength of 370 nm or less; simultaneously removing the organic antireflection coating from the via and developing the photoresist with an aqueous alkaline developer to form a trench mask.

DISCLOSURE OF INVENTION

The present invention involves improved dual damascene methods for substrates by using an ARC containing a dye and a developer soluble material. The ARC containing a dye, often referred to as a dyed BARC, is provided in a via prior to patterning the trench mask. When the dyed BARC is present in a via, improved reflectivity control is achieved, thereby leading to improved pattern fidelity. By providing an ARC containing a dye and a developer soluble material in a via prior to patterning the trench mask, resist contaminants which tend to accumulate in vias when developing the trench mask are minimized and/or eliminated.

The ARC containing a dye or dyed BARC contains a dye and a developer soluble film forming material. The film forming material is preferably soluble in a base or organic solvent, and more preferably soluble in aqueous base. In other words, the film forming material is preferably an organic material (polymer) soluble in a developer. When the film forming material is developer soluble, the dyed BARC can be removed from the via opening when patterning the trench mask. Combining these functions serves to simplify the dual damascene processing. Developers include bases, such as aqueous base solutions (tetramethyl ammonium hydroxide), and organic solvents and acidic solutions. The precise identity of the developer primarily depends upon the identity of the resist used over the dyed BARC.

Examples of the film forming material include organic materials such as poly(p-tert-butoxycarbonyloxy-α-methylstyrene), poly(p-ter-butoxycarbonyloxystyrene), poly(tert-butyl p-vinylbenzoate), poly(tert-butyl p-isopropenylphenyloxyacetate), poly(tert-butyl methacrylate), polymethylmethacrylate, acrylate based polymers, a novolak/diazonaphthoquinione resin, a nitrene crossed hydroxystyrene polymer, poly(butene-1-sulfone), a polymer formed by the hydrogenation of a phenol formaldehyde (novolak) or a poly(vinylphenol) resin, polymers of hydroxystyrene and acrylate, methacrylate, mixtures of acrylate and methacrylate, adamantyl methacrylate, 3-oxo-cyclohexyl methacrylate, tetrahydropyrannymethacrylate, trycyclodecanyl acrylate, isobornyl polymers, polynorbornene, polyanthrylmethacrylate, poly(vinylmethyl ether-co-maliec anhydride), poly(styrene-co-maliec anhydride), a partially t-butoxycarbonyloxy substituted poly-p-hydroxystyrene, partially t-butoxycarbonyloxy substituted poly3-hydroxyphenyl phenylsiloxane, partially t-butyl substituted polymethacrylate, partially adamantyl substituted polymethacrylate, polyvinylidine chloride, polyvinyl acetate, poly(epichlorihydrin), chlorinated polyethylene, brominated and chlorinated polyisobutylenes, halogenated acrylates and methacrylates, novolacs, polyacetals, and alpha substituted polymers such as methyl methacrylates and methylacrylonitrile.

In another embodiment, the film forming material contains a polyamic acid (ester)/imide polymer composition made from polyamines and polyanhydrides. In a preferred embodiment, the polyamic acid (ester)/imide polymer composition has regularly interposed nonamic acidic-functional moieties along the polymer backbone which are abnormal to the amic acid structure. These film forming materials are soluble in aqueous alkaline solutions. The acidic functional groups may include, for example, carboxylic acids (—COOH), aromatic hydroxyls (aryl-OH), and sulfonic acids (—SO$_3$H). In one embodiment, the acidic functional moieties are attached to the diamine side of the polyamic acid/imide. Diamines with acidic functionalities suitable in condensation reactions for preparing polyamic acid (ester)/imide polymer compositions are commercially available. Examples of preferred diamines include 3,5-diaminobenzoic acid (and other isomers such as the 3,4-isomer); 3,3'-dihydroxy-4,4'-diaminobiphenyl; o-tolidine disulfonic acid; 2,4-diaminophenol; 3-amino-4-hydroxyphenyl sulfone; 3,3'- dicarboxy-4,4'-diaminobiphenyl; 2,4-diamino-6-hydroxypyrimidine; and 2,5-diaminobenzensulfonic acid. Many dianhydrides can be used to react with the functionalized diamines. Suitable dianhydrides include the following 3,3'4,4'-benzophenone tetracarboxylic dianhydride (BTDA); pyromellitic dianhydride (PMDA); 3,3',4,4'-biphenyl tetracarboxylic dianhydride (BPDA); and diphenylsulfone-3,3',4,4'-tetracarboxylic dianhydride. It is preferred to spincoat the materials as polyamic acids and then thermally cure them to the polyimide form before development. Preferred solvent systems for polyamic acid preparation and spin-coating include alkyl amides such as N-methylpyrrolidone and dimethylacetamide, methyl sulfoxide, cyclic ketones such as cyclohexanone, and glymes such as 2-methoxyethyl ether.

In another embodiment, the film forming material contains a polyimide precursor which reacts in use to form a polyimide resin. These film forming materials are soluble in aqueous alkaline solutions. The precursor typically includes a polyamic acid prepared by reacting oxydianiline (ODA) with PMDA or may be prepared by reacting ODA with PMDA and BTDA. Other equivalent polyamic acids and polyamic precursors may be used. The reactants for the polyimide precursors are typically included in approximately stoichiometric amounts. The casting solvents include those listed in the paragraph above.

In yet another embodiment, the film forming material contains polymers which include copolymers of sulfur dioxide such as poly(neopentyl sulfone), polybutene-1-sulfone, halogenated polymers and copolymers such as poly(vinylidine chloride-co-vinyl acetate), poly(epichlorihydrin), chlorinated polyethylene, brominated and chlorinated polyisobutylenes, halogenated acrylates and methacrylates and copolymers, polyacetals and acetal copolymers and alpha substituted polymers such as methyl methacrylates and methylacrylonitrile, and equivalent polymers. These film forming materials are soluble in aqueous alkaline solutions.

The dye is effective in absorbing light. In a preferred embodiment, dye is effective in absorbing light over a broad spectrum of light, for example, from about 10 mn to about 800 nm. Exemplary dyes include one or more of curcumin, bixin, norbixin, Solvent Blue 45, Solvent Red 92, Solvent Blue 44, Solvent Blue 35, Solvent Red 111, Solvent Orange 11, Pylakrome Green, IR-99, IR-125, and Solvent Red 127. In one embodiment, the ARC containing a dye or dyed BARC absorbs light having a wavelength of about 400 nm or less. In another embodiment, the dyed BARC absorbs light having a wavelength of about 250 nm or less.

The dyed BARC composition is typically applied to the substrate via spin-on techniques. The casting solvent preferably has a sufficiently low energy so that the resultant film fills the via opening. After spin-coating, the dyed BARC composition is optionally subjected to elevated temperatures or baked to drive off residual solvent thereby forming a film. Since the dyed BARC fills the via openings on the substrate, contaminants do not accumulate in the via opening, which is difficult to clean. The dyed BARC minimizes and/or eliminates reflectivity concerns associated with exposing and developing the second or trench mask during a dual damascene process.

In one embodiment, the dyed BARC has a refractive index from about 1 to about 2.5. In another embodiment, the dyed BARC has a refractive index from about 1.5 to about 2.1. In another embodiment, the dyed BARC has a refractive index from about 1.3 to about 1.9.

FIGS. 3–8 illustrate two embodiments of the methods of the present invention. With regard to the description in connection with the embodiments of FIGS. 3–8, the term substrate includes not only a semiconductor substrate, such as semiconductor substrate 30, but also any and all layers and structures fabricated over the semiconductor substrate up to the point of processing under discussion.

FIGS. 3–8 illustrate methods in connection with forming interconnections that make electrical contact to a structure 12 within a semiconductor substrate 10. However, the method of FIGS. 3–8 may be used to form interconnects for other purposes. For example, the method of FIGS. 3–8 may be adapted to making electrical contacts to various device structures, active elements and passive elements including polysilicon gates, wordlines, source regions, drain regions, bit lines, bases, emitters, collectors, conductive lines, conductive plugs, diffusion regions, etc. The method of FIGS. 3–8 may be used with any suitable semiconductor technology including but not limited to NMOS, PMOS, CMOS, BiCMOS, bipolar, multi-chip modules (MCM) and III–IV semiconductors.

Figure 3:
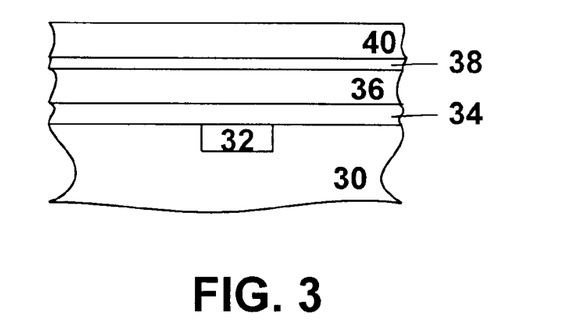
FIG. 3 is cross-sectional illustration of a semiconductor structure during the initial phases of a dual damascene process in accordance with one aspect of the present invention.

Referring to FIG. 3, a semiconductor substrate 30 having metal structure 32 is provided. Semiconductor substrate 30 may include any suitable semiconductor material, for example, a monocrystalline silicon substrate. Metal structure 32 may be any structure to which an electrical contact is desired, for example, a copper line. An insulation material layer 34, such as silicon nitride, is formed over the substrate 30. The insulation material layer 34 may alternatively include one or more of silicon dioxide, silicon oxynitride, boronitride, silicon boronitride and silicon carbide. The insulation material layer 34 may be formed to any suitable thickness using any suitable technique, for instance, using chemical vapor deposition (CVD) techniques. CVD techniques include low pressure chemical vapor deposition (LPCVD) or plasma enhanced chemical vapor deposition (PECVD). In one embodiment, the thickness of the insulation material layer 34 may range, for example, from about 500 Å to about 2,500 Å. The insulation material layer 34 subsequently serves as an etch stop layer for the later described interlayer dielectrics, as well as a barrier layer for the metal structure 12.

An interlayer dielectric 36, containing an insulation material such as an oxide, a silicate, or a low K material, is formed over the insulation material 34. Such materials may be transparent (or partially transparent); thus, reflectivity is facilitated. Low k materials include one or more of polyimides, fluorinated polyimides, polysilsequioxane, benzocyclobutene (BCB), poly(arylene ester), parylene F, parylene N and amorphous polytetrafluoroethylene. Specific examples of a commercially available low k materials include those under the trade designations Flare™ from AlliedSignal, believed to be derived from perfluorobiphenyl and aromatic bisphenols; Black Diamond™ from Applied Materials; ALCAP-S from Asahi Chemical; SiLK® and Cyclotene® BCB from Dow Chemical; Teflon® polytetrafluoroethylene from DuPont; XLK and 3MS from Dow Coming; HSG RZ25 from Hitachi Chemical; HOSP™ and Nanoglass™ from Honeywell Electronic Materials; LKD from JSR Microelectronics; CORAL™ and AF4 from Novellus; mesoporous silica from Battelle PNNL; and Velox™ PAE-2 from Schumacher. Oxides and silicates include silicon dioxide, fluorine doped silicon glass (FSG), tetraethylorthosilicate (TEOS), phosphosilicate glass (PSG), borophosphosilicate glass (BPSG), any other suitable spin-on glass.

The interlayer dielectric 36 may be formed to any suitable thickness using any suitable technique that may depend, for instance, on the material or materials used. Generally, the interlayer dielectric material is formed using CVD or spin-on techniques. The thickness of the interlayer dielectric 36 may range, for example, from about 2,500 Å to about 20,000 Å, but typically from about 5,000 Å to about 10,000 Å.

An ARC layer 38 is formed over the interlayer dielectric 36 in any suitable manner, including spin-on techniques and CVD techniques. ARC layer 38 is made of any light absorbing material, for example, a silicon rich material. An example of a silicon rich material is silicon oxynitride. In this embodiment, ARC layer 38 is an inorganic ARC. In a preferred embodiment, ARC 38 is tuned, through process conditions, to absorb certain reflected wavelengths of light. By absorbing such light, ARC 38 minimizes and/or substantially eliminates potentially damaging reflected interference and/or standing waves during exposure of the resist to actinic radiation. The thickness of the ARC 38 may range, for example, from about 100 Å to about 2,500 Å. A resist 40 is deposited over ARC layer 38 in any suitable manner, including spin-on techniques. The resist 40 is used as a first or via mask to form vias in the structure. Any suitable resist material is employed.

Figure 4:
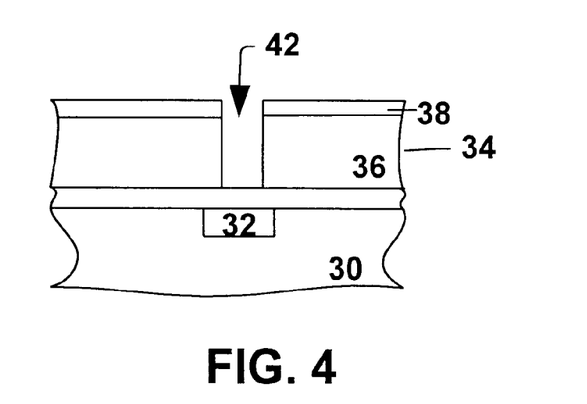
FIG. 4 illustrates a cross-sectional view of a semiconductor structure after a via opening is formed therein according to one aspect of the present invention.

Referring to FIG. 4, the resist layer 40 is initially patterned to define a via opening 42 over at least a portion of a device structure, active element or passive element, or the metal structure 32 in this instance, and then step wise or all at once the ARC layer 38 and interlayer dielectric 36 (and optionally the insulation material layer 34, although not shown) are patterned to further define a via opening 42. Any suitable patterning technique may be used to define the via opening 42 in the structure. For example, standard photolithographic techniques may be used. In particular, the resist layer 40 is exposed to radiation and developed to provide a patterned resist or via mask. The patterned resist is formed using electromagnetic radiation having any suitable wavelength including a relatively small wavelength (for example, less than about 370 nm or less than about 250 nm). Either the exposed or unexposed portions of the resist layer 40 are removed or developed to provide the patterned resist exposing a portion of the ARC layer 38 in the via opening 42.

The exposed portions of the ARC layer 38 are etched anisotropically to further form via opening 42 exposing at least a portion of the interlayer dielectric 36. The exposed portions of the interlayer dielectric 36 are etched anisotropically to even further form via opening 42 exposing at least a portion of the insulation material layer 34. The patterned resist layer 40 may then be stripped from the structure, and the substrate may be optionally cleaned to remove residue from partially formed via opening 42.

Via opening 42 may be formed to have any desired cross-section, width or diameter, such as about 0.1 $\mu$m or less, including about 0.09 $\mu$m or less, about 0.075 $\mu$m or less and about 0.05 $\mu$m or less, primarily depending upon the wavelength of radiation employed. The via openings 42 serve to define subsequently formed contact holes.

Figure 5A:
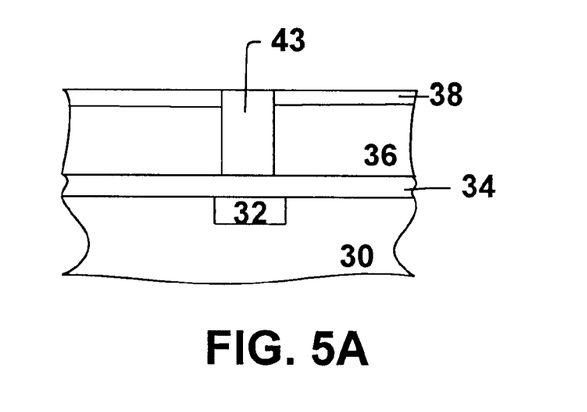
FIGS. 5A and 5B illustrate cross-sectional views of semiconductor structures after providing a BARC material thereon according to one aspect of the present invention.
Figure 5B:
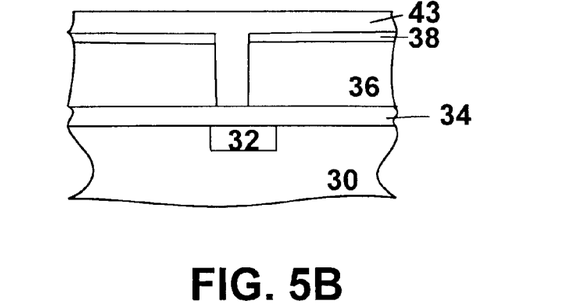

Referring to FIGS. 5A and 5B, two alternative embodiments are shown where a dyed BARC 43 is formed using any suitable technique over the substrate and inside via opening 42, and optionally over the remaining portions of the ARC layer 38 to any suitable thickness. In a preferred embodiment, the dyed BARC 43 is an organic, developer soluble material. This permits removal of the dyed BARC 43 while developing the second or trench resist 44 (described later). The dyed BARC 43 absorbs certain reflected wavelengths of light. By absorbing such light, dyed BARC 43 minimizes and/or substantially eliminates potentially damaging reflected interference and/or standing waves during exposure of the second resist to actinic radiation. Without the dyed BARC 43, actinic radiation employed during the image-wise exposure of the second resist may hinder or deleteriously change the position of features of the resist mask. As a result, increased integration or a higher density layout may be obtained using the dyed BARC 43.

Specifically referring to FIG. 5A, one embodiment is shown where the dyed BARC 43 is formed inside via opening 42, but not over the ARC layer 38. The dyed BARC 43 is deposited by spin-on techniques using a casting solvent, and the substrate is spun to remove the dyed BARC material that does not fill the inside of via opening 42. Specifically referring to FIG. 5B, another embodiment is shown where the dyed BARC 43 is formed inside via opening 42 and additionally over the ARC layer 38. The dyed BARC 43 is deposited by spin-on techniques using a casting solvent, and the substrate is spun to form a substantially uniform (planar) film over the structure. In this embodiment, the reflectivity is substantially the same across the structure.

Figure 6A:
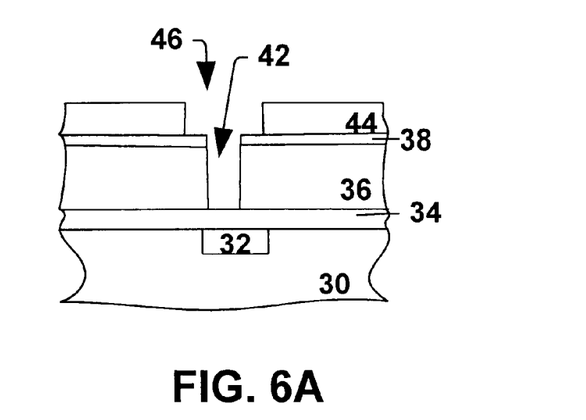
FIGS. 6A and 6B illustrate cross-sectional views of semiconductor structures after patterning a trench mask according to one aspect of the present invention.
Figure 6B:
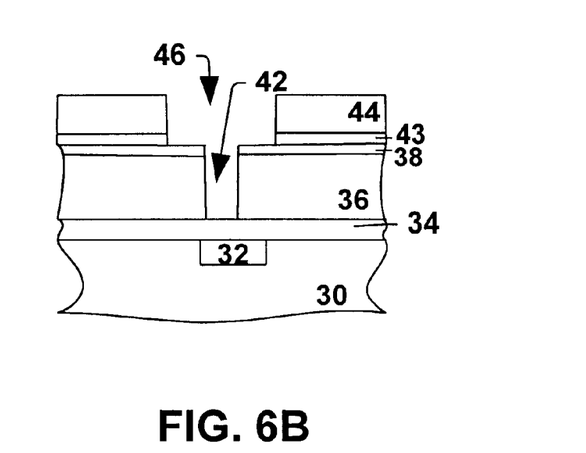

Referring to FIGS. 6A and 6B, a second resist layer 44 is deposited over the structure (either over the ARC layer 38 and the dyed BARC 43 or over the dyed BARC 43) using any suitable means to any suitable thickness. The second resist layer 44 is also known as the second mask layer or the trench mask. In other words, the second resist layer 44 subsequently serves as a trench mask for forming a trench over a plurality of vias.

The second resist layer 44 is patterned to define a trench mask over at least a portion of a device structure, active element or passive element, or the metal structure 12 in this instance. Any suitable patterning technique may be used to define the trench mask in the second resist layer 44. For example, standard photolithographic techniques may be used. In particular, the second resist layer 44 is exposed to radiation and developed to provide a patterned resist. The patterned resist is formed using electromagnetic radiation having any suitable wavelength including a relatively small wavelength (for example, less than about 370 nm). Either the exposed or unexposed portions of the second resist layer 44 and portions of the dyed BARC 43 thereunder are simultaneously removed or developed to provide the patterned resist exposing a portion of the ARC layer 38 and/or the trench region 46 and via opening 42.

The dyed BARC 43 is removed in the same step as developing the second resist layer 44. In this instance, the dyed BARC material is soluble in the developer employed to pattern the second resist layer 44. For example, the dyed BARC material may be a base soluble material (or more specifically soluble in an aqueous base).

Figure 7:
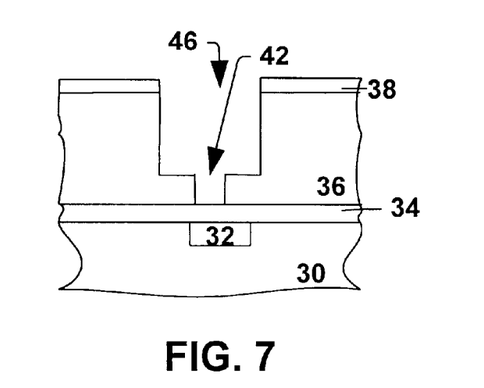
FIG. 7 illustrates a cross-sectional view of a semiconductor structure after a trench is formed therein according to one aspect of the present invention.

Referring to FIG. 7, the exposed portions of the ARC layer 38 and/or the dyed BARC 43 and a portion of the interlayer dielectric 36 are etched anisotropically to further form the trench 46 exposing at least a portion of the interlayer dielectric 36. In one embodiment, the ARC layer 38 and/or the remaining portions of the dyed BARC 43 are removed from trench 46 using wet etching techniques, such as using an acid (hydrofluoric acid or phosphoric acid). The interlayer dielectric 36 is preferably etched using plasma etching techniques. Any remaining portions of the second resist layer 44 may removed or stripped from the structure.

The trench 46 may be formed to have any desired cross-section, width or diameter, such as about 0.25 $\mu$m, about 0.18 $\mu$m, about 0.15 $\mu$m, about 0.13 $\mu$m, about 0.1 $\mu$m, about 0.075 and/or about 0.05 $\mu$m. The width of the trench 46 may depend on the resistivity of the conductive material used for creating an interconnect within the trench 46. The width of the trench 46 is typically larger than the width of previously described via opening 42. The opening in the structure includes trench 46 and via opening 42.

Figure 8:
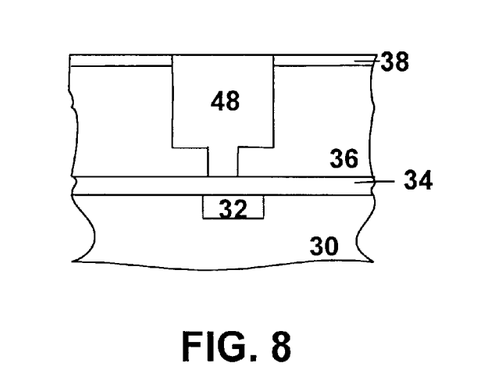
FIG. 8 illustrates a cross-sectional view of a semiconductor structure after a conductive layer is formed and planarized according to one aspect of the present invention.

Referring to FIG. 8, the exposed portion of the insulation material layer 34 is etched in an anisotropic manner using a suitable gas mixture, primarily depending upon the composition of the insulation material layer 34 exposing at least a portion of the metal structure 12 along via opening 42. The second resist layer 44 may then be stripped from the substrate if not done so previously, and the substrate may be optionally cleaned to remove residue from the opening 42.

One or more suitable conductive materials is formed or deposited over the substrate, including filling the trench 46 and via opening 42 and over the ARC layer 38. For example, an optional barrier layer (not shown) and a conductive layer 48 are deposited over the structure. The optional barrier layer may serve as a diffusion barrier preventing materials from the conductive layer 48 from diffusing into the interlayer dielectric 36. The optional barrier layer is formed over the substrate so that it covers the side walls and bottom in the trench 46 and via opening 42. The barrier layer may be formed using any suitable technique to a thickness sufficient to serve as a diffusion barrier for conductive layer 48. For example, the thickness of the barrier layer may be in the range from about 300 Å to about 500 Å. The barrier layer is a conductive layer containing, for example, tantalum, tungsten, titanium, alloys, silicides, and/or nitrides thereof.

Conductive layer 48 is then formed over the substrate, substantially filling trench 46 and via opening 42. The conductive layer may be made of any suitable conductive material or materials. Examples of suitable conductive materials include copper, tungsten, gold, silver, aluminum, any alloys and/or combinations thereof. In this embodiment, the conductive material is copper or a copper alloy. The conductive layer 48 may be formed to any suitable thickness using any suitable technique. For example, the thickness of the conductive layer 48 may range from about 0.1 $\mu$m to about 2 $\mu$m.

The optional barrier layer and the conductive layer 48 may be deposited using CVD techniques or physical vapor deposition techniques. Alternatively, when copper is used as the conductive layer, the surface of the barrier layer may be activated using copper atoms (copper seeds) by contact displacement followed by the autocatalytic deposition of electrolessly deposited copper.

The conductive layer 48 is planarized to the surface of the ARC layer 38; that is, portions of the conductive layer 48 are removed from the top surface of the ARC layer 38 above the interlayer dielectric 36. Trench 46 and via opening 42 remains substantially filled with the optional barrier layer and conductive layer 48. Any suitable technique may be used to planarize the substrate and may depend, for instance, on the specific identity of the material used to make the conductive layer 30. In one embodiment, the substrate is planarized (a portion of the conductive layer is removed) using chemical mechanical polishing (CMP) techniques using a polishing solution or slurry depending upon the specific identity of the materials used for the conductive layer 48.

The portion of the optional barrier layer, if employed, exposed over the ARC layer 38 is removed using CMP techniques or an etch gas mixture. After the portion of the barrier layer exposed over the ARC layer 38 is removed, the structure may be cleaned using conventional techniques such as wet cleaning techniques. Removal of the exposed portion of the barrier layer serves to planarize the structure while leaving undisturbed the portion of the barrier layer surrounding conductive layer 48. If employed, the etch gas mixture has high etch selectivity for the barrier metal as compared to an ARC material, such as silicon oxynitride, which may constitute the ARC layer 38 as well as other conductive metals such as copper or copper alloys, which may constitute the conductive layer 48.

Generally referring to FIGS. 3–8, the methods disclosed herein may be used to create another via layer and another trench layer. In fact, it will be appreciated that the method can be used repeatedly to create multilayered structures with numerous via layers and/or trench layers.

Figure 9:
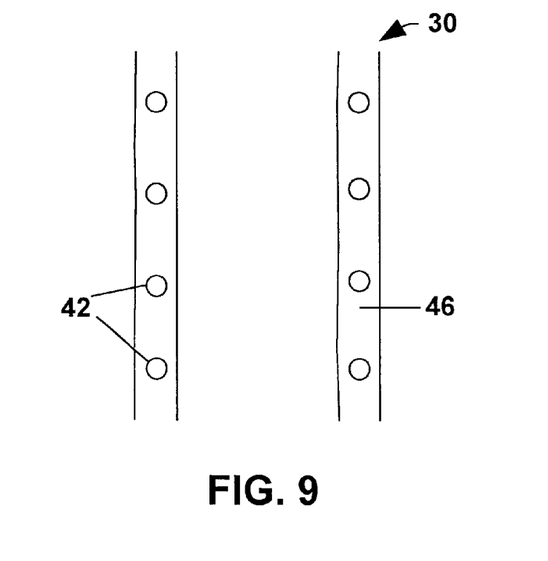
FIG. 9 is a top down illustration of a trench/via pattern in a substrate made using a dual damascene process in accordance with one aspect of the present invention.

As a result of the methods of the present invention, it possible to consistently and accurately form trenches directly over vias. Referring to FIG. 9, these results are shown as a top-down view of the structure in FIG. 8. On substrate 30, trenches 46 are accuratley patterned directly over via openings 42. Consequently, dual damascene processing is improved by the present invention.

Various modifications can be made the sequence of steps described above. For example, the interlayer dielectric 36 initially mentioned in FIG. 3 may constitute about one-half (in thickness) of the thickness of the interlayer dielectric 36 mentioned in FIG. 7. In this connection, after formation of the via opening 42, additional interlayer dielectric material may be formed over the structure before the second resist layer 44 is deposited and patterned (before the steps described in FIGS. 6A and 6B). The trench 46 is then formed in the additional interlayer dielectric material.

Alternatively, just prior to providing the additional interlayer dielectric material over the structure before the second resist layer 44 is deposited and patterned, a barrier or hard mask layer of silicon dioxide, may be deposited over the first half of the interlayer dielectric 36 using suitable techniques, such as CVD techniques. The barrier or hard mask layer may alternatively include one or more of silicon nitride, silicon oxynitride, boronitride, silicon boronitride and silicon carbide. The thickness of the barrier or hard mask layer may range, for example, from about 500 Å to about 2,500 Å.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing a semiconductor structure, comprising:

providing a substrate having an insulation layer thereover;

forming a first antireflection coating over the insulation layer;

patterning a first resist over the antireflection coating;

forming a plurality of vias in the insulation layer and the first antireflection coating, the vias having a first width;

filling the via with a second antireflection coating, the second antireflection coating comprising a dye and a developer soluble film forming material;

patterning a second resist over the structure and simultaneously removing the second antireflection coating from the via;

forming a trench over the plurality of vias in the insulation layer, the trench having a second width that is larger than the first width; and filling the trench and vias with a conductive material.

2. The method of processing a semiconductor structure according to claim 1, wherein the second antireflection coating is removed simultaneously from the via during the patterning of the second resist using an aqueous alkaline developer.

3. The method of processing a semiconductor structure according to claim 1, wherein the first antireflection coating comprises silicon oxynitride.

4. The method of processing a semiconductor structure according to claim 1, wherein the second antireflection coating covers at least a portion of the first antireflection coating.

5. The method of processing a semiconductor structure according to claim 1, wherein the second antireflection coating comprises at least one of poly(p-tert-butoxycarbonyloxy-α-methylstyrene), poly(p-tert-butoxycarbonyloxystyrene), poly(tert-butyl p-vinylbenzoate), poly(tert-butyl p-isopropenylphenyloxyacetate), poly(tert-butyl methacrylate), polymethylmethacrylate, an acrylate based polymer, a novolak/diazonaphthoquinione resin, a nitrene crossed hydroxystyrene polymer, poly(butene-1-sulfone), a polymer formed by the hydrogenation of a phenol formaldehyde or a poly(vinylphenol)resin, polymers of hydroxystyrene and acrylate or methacrylate, isobornyl polymers, polynorbornene, polyanthrylmethacrylate, poly(vinylmethyl ether-co-maliec anhydride), poly(styrene-co-maliec anhydride), a partially t-butoxycarbonyloxy substituted poly-p-hydroxystyrene, partially t-butoxycarbonyloxy substituted poly-3-hydroxyphenyl phenylsiloxane, partially t-butyl substituted polymethacrylate, partially adamantyl substituted polymethacrylate, polyvinylidine chloride, polyvinyl acetate, poly(epichlorihydrin), chlorinated polyethylene, brominated and chlorinated polyisobutylenes, halogenated acrylates and methacrylates, novolacs, polyacetals, polyvinylidine chloride, polyvinyl acetate, poly (epichlorihydrin), chlorinated polyethylene, brominated and chlorinated polyisobutylenes, halogenated acrylates and methacrylates, polyacetals, and alpha substituted polymers such as methyl methacrylates and methylacrylonitrile.

6. The method of processing a semiconductor structure according to claim 1, wherein the second antireflection coating absorbs light having a wavelength of about 400 nm or less.

7. The method of processing a semiconductor structure according to claim 1, wherein the insulation layer has a thickness from about 2,500 Å to about 20,000Å.

8. The method of processing a semiconductor structure according to claim 1, wherein the insulation layer comprises at least one of polyimides, fluorinated polyimides, polysilsequioxane, benzocyclobutene, parlene F, parlene N and amorphous polytetrafluoroethylene, silicon dioxide, fluorine doped silicon glass, tetraethylorthosilicate, phosphosilicate glass, and borophosphosilicate glass.

9. A dual damascene process, comprising:

depositing a silicon oxynitride layer over a substrate comprising an interlayer dielectric;

patterning a first resist over the silicon oxynitride layer;

forming a via within the interlayer dielectric and the silicon oxynitride layer;

depositing an organic antireflection coating into the via, the organic antireflection coating comprising a dye and a film forming material;

depositing a second resist layer over the substrate;

developing the second resist layer and simultaneously removing the organic antireflection coating from the via;

forming a trench within the interlayer dielectric and the silicon oxynitride layer and directly above the via; and depositing a conductive metal into the trench and the via.

10. The dual damascene process according to claim 9, wherein the organic antireflection coating is deposited into the via by spin-on techniques.

11. The dual damascene process according to claim 9, wherein the silicon oxynitride layer is deposited by chemical vapor deposition.

12. The dual damascene process according to claim 9, wherein the dye comprises at least one selected from the group consisting of curcumin, bixin, norbixin, Solvent Blue 45, Solvent Red 92, Solvent Blue 44, Solvent Blue 35, Solvent Red 111, Solvent Orange 11, and Solvent Red 127.

13. The dual damascene process according to claim 9, wherein the trench has a width of about 0.25 μm or less and the via has a width of about 0.18 μm or less, and the width of the trench is larger than the width of the via.

14. The dual damascene process according to claim 9, wherein the interlayer dielectric has a thickness from about 5,000 Å to about 10,000Å.

15. The dual damascene process according to claim 9, wherein the interlayer dielectric comprises at least one of polyimides, fluorinated polyimides, polysilsequioxane, benzocyclobutene, parlene F, parlene N and amorphous polytetrafluoroethylene, silicon dioxide, fluorine doped silicon glass, tetraethylorthosilicate, phosphosilicate glass, and borophosphosilicate glass.

16. A method of forming a trench mask in a dual damascene process, comprising:

providing a substrate comprising an insulation layer thereon having an inorganic antireflection coating thereover, the insulation layer and the inorganic antireflection coating comprising a via therein;

depositing an organic antireflection coating comprising a dye and a film forming material over the inorganic antireflection coating and into the via;

depositing a photoresist over the organic antireflection coating;

irradiating the photoresist with light having a wavelength of 370 nm or less;

simultaneously removing the organic antireflection coating from the via and developing the photoresist with an aqueous alkaline developer to form a trench mask.

17. The method of forming a trench mask in a dual damascene process according to claim 16, wherein the organic antireflection coating is deposited using spin-on techniques.

18. The method of forming a trench mask in a dual damascene process according to claim 16, wherein the photoresist is irradiated with light having a wavelength of 250 nm or less.

19. The method of forming a trench mask in a dual damascene process according to claim 16, wherein the trench mask has an opening having a width of about 0.18 μm or less and the via has a width of about 0.15 μm or less, and the width of the trench mask opening is larger than the width of the via.

20. The method of forming a trench mask in a dual damascene process according to claim 16, wherein the organic antireflection coating has a refractive index from about 1 to about 2.5.

* * * * *